(12) United States Patent
Decottignies et al.

(10) Patent No.: US 12,400,885 B2
(45) Date of Patent: Aug. 26, 2025

(54) MODULAR MULTI-CHAMBER PROCESSING TOOL HAVING LINK CHAMBER FOR ULTRA HIGH VACUUM PROCESSES

(71) Applicant: Applied Materials, Inc., Santa Clara, CA (US)

(72) Inventors: Robert Irwin Decottignies, San Carlos, CA (US); Marek W Radko, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 565 days.

(21) Appl. No.: 17/692,969

(22) Filed: Mar. 11, 2022

(65) Prior Publication Data
US 2023/0317478 A1    Oct. 5, 2023

(51) Int. Cl.
*H01L 21/67* (2006.01)
*C23C 14/56* (2006.01)
*H01L 21/687* (2006.01)

(52) U.S. Cl.
CPC ...... *H01L 21/67184* (2013.01); *C23C 14/566* (2013.01); *C23C 14/568* (2013.01); *H01L 21/67017* (2013.01); *H01L 21/67167* (2013.01); *H01L 21/67201* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 6,309,116 B1 * | 10/2001 | Mahara | H01L 21/67178 414/940 |
| 6,582,175 B2 * | 6/2003 | Cox | H01L 21/68707 414/229 |
| 6,672,864 B2 * | 1/2004 | Wang | H01L 21/67017 414/217 |
| 7,575,406 B2 | 8/2009 | Hofmeister et al. | |
| 8,734,720 B2 * | 5/2014 | Nichols | G01N 35/04 422/65 |

(Continued)

FOREIGN PATENT DOCUMENTS

| | | |
|---|---|---|
| CN | 112786507 A | 5/2021 |
| KR | 10-0490702 B1 | 5/2005 |

OTHER PUBLICATIONS

International Search Report for PCT/US2022/036710, dated Nov. 28, 2022.

*Primary Examiner* — Jethro M. Pence
(74) *Attorney, Agent, or Firm* — Moser Taboada

(57) ABSTRACT

Embodiments of link chamber for use in multi-chamber processing tools or systems are provided herein. In some embodiments, a link chamber for use in a multi-chamber processing tool includes: a link chamber body having a plurality of facets extending between a bottom plate and a top plate, wherein at least seven of the plurality of facets have a chamber opening to form a plurality of chamber openings, wherein the plurality of chamber openings are sized to pass a substrate therethrough, and wherein each of the plurality of chamber openings are configured to be coupled to a slit valve, a load lock chamber, a cover plate, a process chamber, or a second link chamber body.

20 Claims, 6 Drawing Sheets

(56) References Cited

U.S. PATENT DOCUMENTS

| | | | |
|---|---|---|---|
| 8,771,804 B2* | 7/2014 | Dordi | H01L 21/76814 |
| | | | 427/532 |
| 9,230,835 B2 | 1/2016 | Gelatos et al. | |
| 2003/0073323 A1 | 4/2003 | Kim et al. | |
| 2003/0131458 A1 | 7/2003 | Wang et al. | |
| 2007/0269297 A1* | 11/2007 | Meulen | H01L 21/68792 |
| | | | 414/416.01 |
| 2008/0175694 A1* | 7/2008 | Park | H01L 21/67742 |
| | | | 414/217.1 |
| 2008/0206036 A1* | 8/2008 | Smith | H01L 21/67178 |
| | | | 414/788 |
| 2019/0214284 A1* | 7/2019 | Rice | H01L 21/67184 |
| 2021/0143034 A1 | 5/2021 | Rice et al. | |
| 2022/0139740 A1 | 5/2022 | Decottignies et al. | |
| 2023/0040192 A1* | 2/2023 | Rye | H01L 21/67742 |

* cited by examiner

MODULAR MULTI-CHAMBER PROCESSING TOOL HAVING LINK CHAMBER FOR ULTRA HIGH VACUUM PROCESSES

FIELD

Embodiments of the present disclosure generally relate to substrate processing equipment.

BACKGROUND

Manufacturing of semiconductor devices typically involves performing a sequence of procedures with respect to a substrate or "wafer" such as a silicon substrate, a glass plate, etc. These steps may include polishing, deposition, etching, photolithography, heat treatment, and the like. Usually, a number of different processing steps may be performed in a single processing system or "tool" which includes a plurality of processing chambers. However, other processes may be performed at other processing locations within a fabrication facility, thereby necessitating that substrates be transported within the fabrication facility from one processing location to another. Depending on the type of semiconductor device to be manufactured, there may be a relatively large number of processing steps performed at many different processing locations within the fabrication facility.

Substrates are conventionally transported from one processing location to another within substrate carriers such as sealed pods, cassettes, containers and so forth. Such transport of substrates typically involves exposing the substrates to room air, or at least to non-vacuum conditions. Either may expose the substrates to an undesirable environment (e.g., oxidizing species) and/or contaminants.

Accordingly, the inventors have provided embodiments of improved multi chambered processing tools for minimizing exposure of substrates to undesirable environments when transferring substrates between processing systems.

SUMMARY

Embodiments of link chamber for use in multi-chamber processing tools are provided herein. In some embodiments, a link chamber for use in a multi-chamber processing tool includes: a link chamber body having a plurality of facets extending between a bottom plate and a top plate, wherein at least seven of the plurality of facets have a chamber opening to form a plurality of chamber openings, wherein the plurality of chamber openings are sized to pass a substrate therethrough, and wherein each of the plurality of chamber openings are configured to be coupled to a slit valve, a load lock chamber, a cover plate, a process chamber, or a second link chamber body.

In some embodiments, a multi-chamber processing tool includes: a factory interface (FI) having one or more loadports configured to receive a substrate; a link chamber coupled to the FI, wherein the link chamber includes a plurality of facets extending between a bottom plate and a top plate, wherein at least seven of the plurality of facets have a chamber opening to form a plurality of chamber openings, wherein the bottom plate includes one or more pump ports, and wherein the bottom plate includes a plurality of valve openings proximate corresponding ones of the chamber openings; a plurality of process chambers coupled to the link chamber via respective ones of the chamber openings; one or more load lock chambers coupled to the link chamber via respective one or more chamber openings; and a link robot disposed in the link chamber and configured to facilitate transferring the substrate from the FI to the plurality of process chambers via the one or more load lock chambers.

In some embodiments, a multi-chamber processing tool, includes: a factory interface (FI) having one or more loadports configured to receive a substrate; a link chamber coupled to the FI, wherein the link chamber includes a plurality of facets extending between a bottom plate and a top plate, wherein at least seven of the plurality of facets have a chamber opening to form a plurality of chamber openings that are similarly sized, wherein the bottom plate includes one or more pump ports, and wherein the bottom plate includes a plurality of valve openings proximate corresponding ones of the chamber openings; a plurality of process chambers coupled to the link chamber via respective ones of the chamber openings; one or more load lock chambers coupled to the link chamber via respective one or more chamber openings; and a link robot disposed in the link chamber and configured to facilitate transferring the substrate from the FI to the plurality of process chambers via the one or more load lock chambers.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
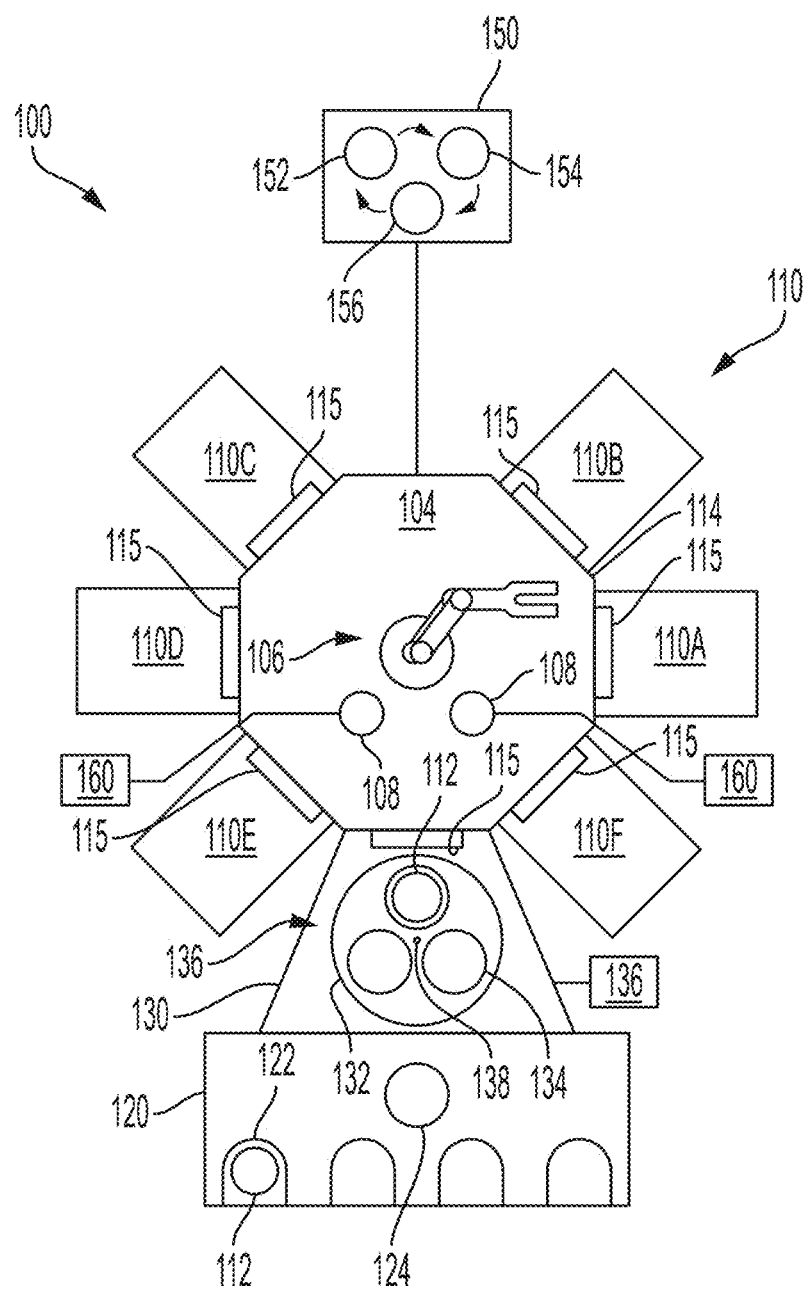
FIG. 1 depicts a schematic top view of a multi-chamber processing tool having a link chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of link chambers for use in multi-chamber processing tools are provided herein. The link chamber includes a plurality of facets for modular and customizable coupling with a factory interface and a plurality of process chambers to form the multi-chamber processing tool. The link chambers provided herein are generally configurable to facilitate coupling to a plurality of process chambers such as deposition chambers, etch chambers, clean chamber, degas chamber, metrology chambers, or the any other suitable chamber for ultra-high vacuum processing. As such, the link chambers described herein advantageously provide a central hub for passing substrates from the factory interface to the plurality of process chambers via the link chamber. The link chambers are configured to provide a smaller footprint and lower cost than typical multi-chamber architectures.

The link chambers may be used to support systems with various degrees of complexity. The link chambers provided herein are also advantageously configured to be coupled with one or more other link chambers or one or more other multi-chamber processing tools via transfer vias disposed therebetween to support more complex substrate processing while minimizing floorspace and processing downtime. As such, the link chambers provided herein facilitate forming a multi-chamber processing tool or a link between multiple multi-chamber processing tool for any desired substrate process. In some embodiments, the desired substrate process may be an ultra-high vacuum metallization process, for example, a copper interconnect process. However, any suitable process requiring a vacuum or ultra-high vacuum environment may be performed with the tools provided herein.

FIG. 1 depicts a schematic top view of a multi-chamber processing tool having a link chamber in accordance with at least some embodiments of the present disclosure. The multi-chamber processing tool 100 includes a plurality of facets 114. In some embodiments, the plurality of facets 114 comprises at least seven facets. Each of the facets 114 have a chamber opening (see plurality of chamber openings 304 in FIG. 3) that is connectable or coupled to a load lock chamber 130, one of a plurality of process chambers 110 (plurality of process chambers 110A-110F shown in FIG. 1), or a transfer via (see transfer via 508 in FIG. 5). The link chamber 104 includes a transfer robot 106 disposed therein. In some embodiments, the transfer robot 106 is operable to transfer one or more substrates 112 between the load lock chamber 130 and the plurality of process chambers 110, between the plurality of process chambers 110. In some embodiments, the transfer robot 106 is configured to transfer the one or more substrates 112 between the plurality of process chambers 110 and the transfer via 508.

The multi-chamber processing tool 100 includes a factory interface (FI) 120 having one or more loadports 122 configured to receive one or more substrates 112. The link chamber 104 is coupled to the FI 120 via the one or more load lock chambers 130. The one or more substrates 112 may be transferred from the FI 120 to the one or more load lock chambers 130 via a FI robot 124 disposed in the FI 120. In some embodiments, the one or more load lock chambers 130 include one load lock chamber as depicted in FIG. 1. In some embodiments, the one or more load lock chambers 130 include a substrate transfer mechanism configured to move the one or more substrates 112 from a location proximate the FI 120 to a location proximate the link chamber 104. The one or more load lock chambers 130 are generally vacuum chambers coupled to respective vacuum pumps that facilitate transfer of the one or more substrates 112 from ambient pressure of the FI 120 to the vacuum pressure of the link chamber 104. The one or more load lock chambers 130 may be coupled to respective vacuum pumps.

In some embodiments, the substrate transfer mechanism is a substrate carousel 136 as depicted in FIG. 1. The substrate carousel 136 may generally comprise one or more substrate supports 134 configured to rotate within the load lock chamber to move the one or more substrates 112. In some embodiments, the one or more substrate supports 134 are coupled to a base plate 132. In some embodiments, the substrate carousel 136 comprises three substrate supports that rotate about a rotational axis 138.

In some embodiments, the plurality of process chambers 110 include six process chambers. In some embodiments, the plurality of process chambers 110 include four deposition chambers, for example process chambers 110A-110D, and two cleaning chambers, for example process chambers 110E-110F. In some embodiments, the four deposition chambers are physical vapor deposition (PVD) chambers. In some embodiments, the four deposition chambers are any suitable combination of PVD chambers, chemical vapor deposition (CVD) chambers, or atomic layer deposition (ALD) chambers. In some embodiments, the plurality of process chambers 110 are vacuum chambers coupled to respective vacuum pumps.

Figure 2:
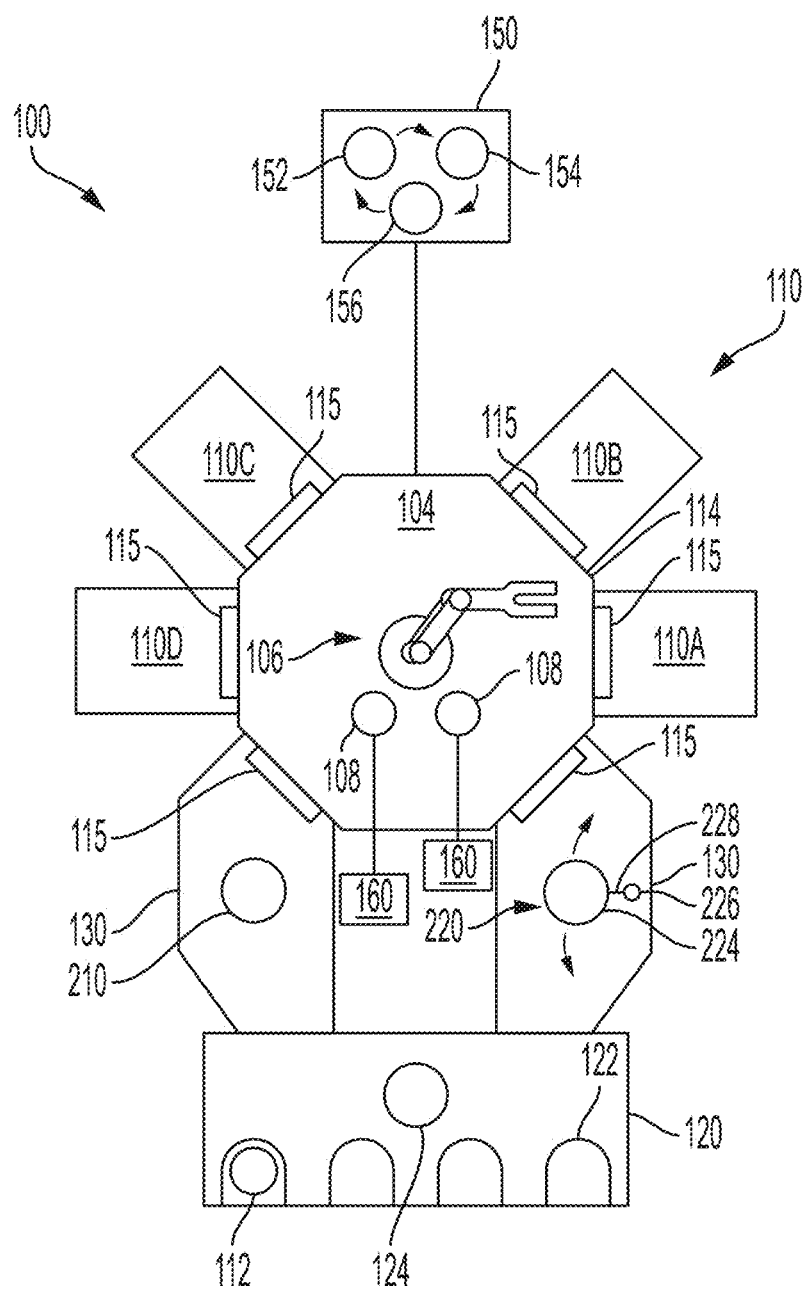
FIG. 2 depicts a schematic top view of a multi-chamber processing tool having a link chamber in accordance with at least some embodiments of the present disclosure.

FIG. 2 depicts a schematic top view of a multi-chamber processing tool 100 having a link chamber 104 in accordance with at least some embodiments of the present disclosure. In some embodiments, as shown in FIG. 2, the one or more load lock chambers 130 comprises two load lock chambers coupled to respective facets of the plurality of facets 114 at a first end and the FI 120 at a second end. In some embodiments, the plurality of process chambers 110 include four process chambers. In some embodiments, the substrate transfer mechanism comprises a load lock transfer robot 210. In some embodiments, the substrate transfer mechanism comprises a servo-controlled shutter 220. In some embodiments, the servo-controller shutter 220 comprises a shutter 224 coupled to a servo motor 226. The servo motor 226 may be coupled to the shutter 224 via an arm 228 such that rotation of the servo motor 226 moves the shutter 224 towards or away from the link chamber 104.

Referring to FIGS. 1 and 2, in some embodiments, slit valves 115 are disposed at the interfaces of the plurality of process chambers 110 and the link chamber 104 and interfaces of the load lock chamber 130 and the link chamber 104 and configured to selectively seal one or more of the plurality of facets 114. In some embodiments, one or more of the slit valves 115 include a linear motion actuator to move a slit valve door to selectively seal or open a slit opening to facilitate transfer of the one or more substrates 112 therethrough. In some embodiments, one or more of the slit valves 115 include an "L" motion actuator to move the slit valve door in an "L" motion (vertical and horizontal movement) to selectively seal or open a slit opening to facilitate transfer of the one or more substrates 112 therethrough.

With the slit valves 115, the link chamber 104 can be separately isolated from the plurality of process chambers 110 and the one or more load lock chambers 130. Vacuum pumps 160, such as cryopumps, turbopumps, or the like, may be coupled to the link chamber 104 via pump ports 108 for pumping down the link chamber 104. The vacuum pumps 160 are operable to maintain the vacuum level of the link chamber 104. In some embodiments, the link chamber 104 includes two pump ports 108, one pump port coupled to a cryopump, and a second pump port coupled to a turbopump.

In some embodiments, the link chamber 104 includes a controller 150 coupled to the link chamber 104 and operable to receive data from the plurality of process chambers 110 and to provide instructions to the multi-chamber processing tool 100 to process commands directed to processing and transfer of the one or more substrates 112. The controller 150 comprises a centralized server that may implement predictive modeling, such as machine learning, artificial intelligence, and/or deep learning, to increase throughput and efficiency of the multi-chamber processing tool 100 and any tools or systems linked to the multi-chamber processing tool 100, for example a second multi-chamber processing tool having a second link chamber (e.g., second multi-chamber processing tool 502) or a second processing tool (e.g., second processing tool 602). In some embodiments, the controller 150 is configured to be in communication with a second controller 550 of the second multi-chamber processing tool 502 or second controller 650 of the second processing tool 602. The controller 150 is operable to receive and/or send data from the second controllers 550, 650, apply predictive modeling to the data, and provide instructions to the second controllers 550, 650 corresponding to process commands directed to processing in and transfer of one or more substrates from the process chambers of linked first multi-chamber processing tool 100 and the second processing tools 502, 602.

The controller 150 generally includes a central processing unit (CPU) 152 comprising one or more processors, a memory 154, and a support circuit 156. The CPU 152 may be any form of a general-purpose computer processor that can be used in an industrial setting. The support circuit 156 is conventionally coupled to the CPU 152 and may comprise a cache, clock circuits, input/output subsystems, power supplies, and the like. Software routines, such as a method as described herein may be stored in the memory 154 and, when executed by the CPU 152, transform the CPU 152 into a specific purpose computer (controller 150). The software routines may also be stored and/or executed by a second controller (not shown) that is located remotely from the multi-chamber processing tool 100.

The memory 154 may be in the form of a non-transitory computer-readable storage media that contains instructions, when executed by the CPU 152, to facilitate the operation of the multi-chamber processing tool 100. The instructions in the memory 154 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
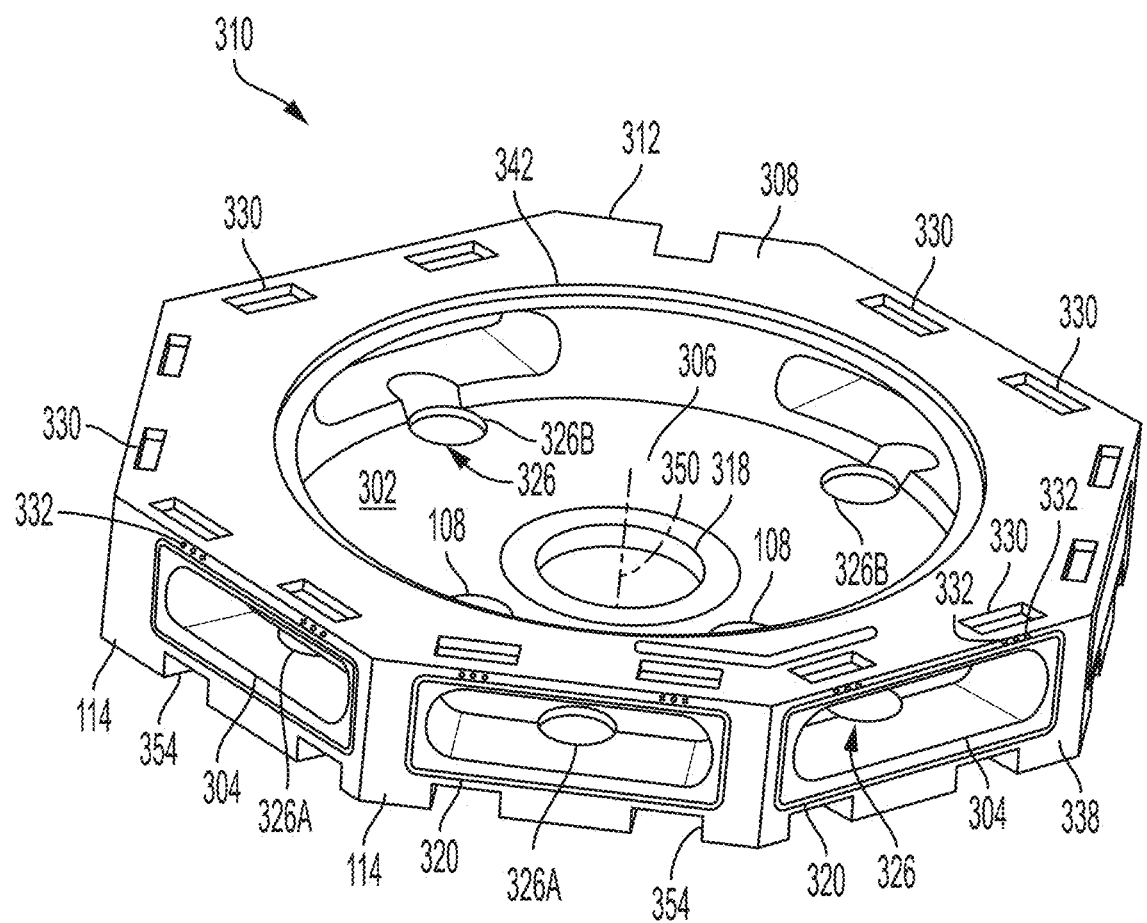
FIG. 3 depicts a schematic isometric view of a link chamber in accordance with at least some embodiments of the present disclosure.

FIG. 3 depicts a schematic isometric view of a link chamber body 310 in accordance with at least some embodiments of the present disclosure. The link chamber 104 generally includes a link chamber body 310 having the plurality of facets 114 extending between a bottom plate 306 and a top plate 308. In some embodiments, the link chamber body 310 has an octagon shape. In some embodiments, the controller 150 is coupled to the link chamber body 310 on a side 312 of the link chamber body 310 that does not include one of the plurality of facets 114. Each of the plurality of facets 114 include a chamber opening to form a plurality of chamber openings 304. The plurality of chamber openings 304 are sized to pass a substrate therethrough. In some embodiments, the plurality of chamber openings 304 are similarly sized.

Each of the plurality of chamber openings 304 are configured to be coupled to a slit valve (e.g., slit valve 115), a load lock chamber (e.g., load lock chamber 130), a process chamber (e.g., process chamber 110), a cover plate (e.g., cover plate 410), or a transfer via (e.g., transfer via 508). In some embodiments, each of the plurality of facets 114 include a seal groove 320 disposed about the chamber openings 304 and configured to house a seal.

The bottom plate 306 and the top plate 308, and the plurality of facets 114 generally define an interior volume 302 of the link chamber 104. In some embodiments, the bottom plate 306 includes a central opening 318 for accommodating the transfer robot 106. In some embodiments, one or more pump ports 108 are disposed through the bottom plate 306. In some embodiments, the one or more pump ports 108 are disposed radially outward of the central opening 318.

In some embodiments, the bottom plate 306 includes a plurality of actuator openings 326 proximate corresponding ones of the plurality of chamber openings 304 and configured for passing an actuator of the one or more slit valves 115 therethrough. For slit valves having linear motion actuators, the bottom plate 306 includes actuator openings 326A that extend substantially parallel with respect to a vertical axis 350 of the link chamber body. For slit valves having "L" motion actuators, the bottom plate 306 includes angled actuator openings 326B that extend at an angle that is not ninety degrees with respect to the vertical axis 350 of the link chamber body 310.

In some embodiments, the top plate 308 includes one or more recesses 330 proximate each of the plurality of chamber openings 304. In some embodiments, the one or more recesses 330 comprise two recesses for each of the plurality of chamber openings 304. In some embodiments, each of the one or more recesses 330 include fastener openings 332 extending from the one or more recesses 330 to an outer sidewall 338 of the link chamber body 310. The fastener openings 332 may facilitate coupling the link chamber to chamber components, such as the one or more slit valves 115, any of the chambers disclosed herein, or a cover plate 410. In some embodiments, the link chamber body 310 includes lower recesses 354 to facilitate coupling the link chamber 104 chamber components, such as the one or more slit valves 115, any of the chambers disclosed herein, or a cover plate 410. In some embodiments, the top plate 308 includes a lid opening 342. The lid opening 342 may be selectively sealed via a lid (see lid 402) that is removably coupled to the top plate 308 to facilitate access to the interior volume 302.

Figure 4:
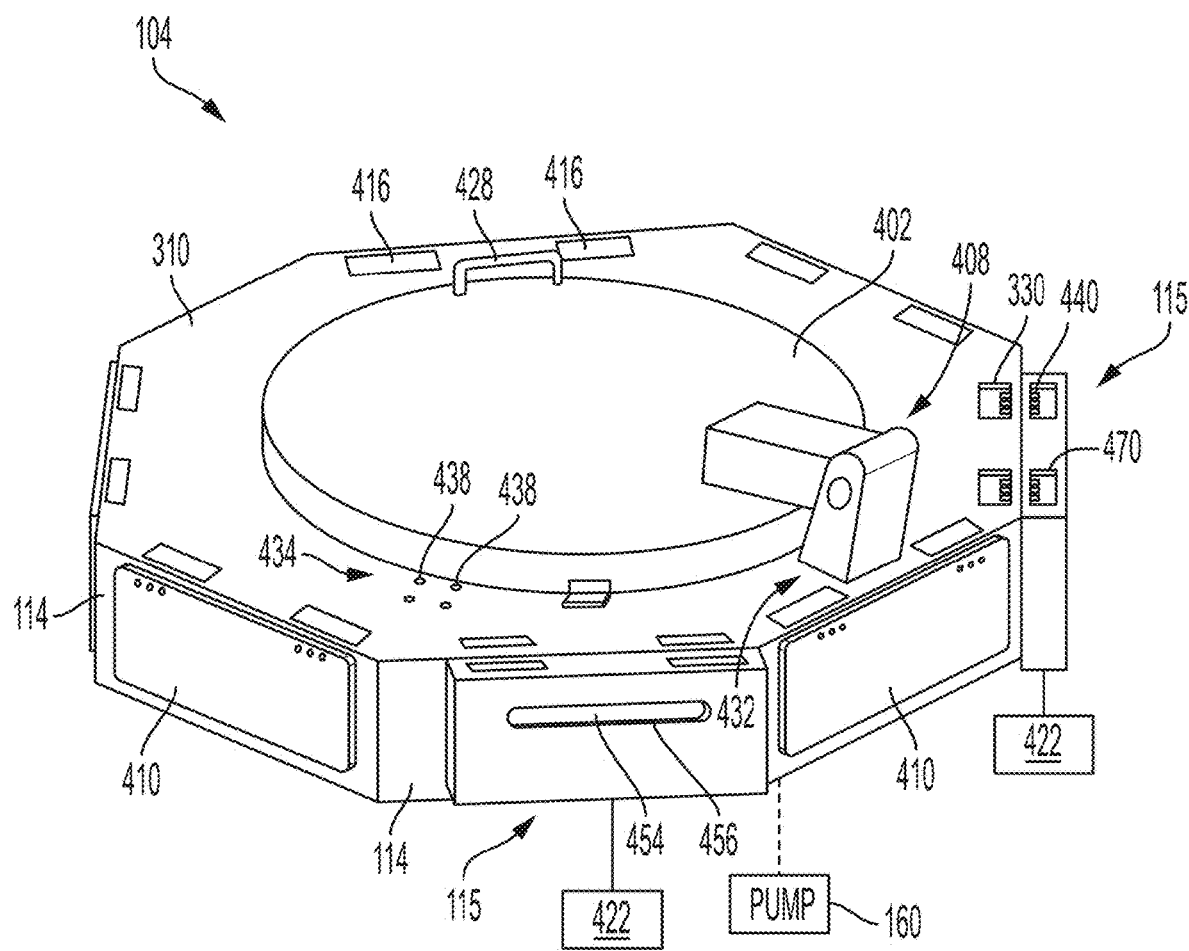
FIG. 4 depicts an isometric view of a link chamber body in accordance with at least some embodiments of the present disclosure.

FIG. 4 depicts an isometric view of a link chamber 104 in accordance with at least some embodiments of the present disclosure. In some embodiments, the link chamber 104 includes a lid 402 coupled to the top plate 308 of the link chamber body 310. In some embodiments, the lid 402 is pivotably coupled to the top plate 308. In some embodiments, a support apparatus 408 is coupled to the lid 402 and the top plate 308 and facilitates opening and closing of the lid 402. In some embodiments, the lid 402 includes a handle 428 for manual opening and closing of the lid 402. In some embodiments, the support apparatus 408 is coupled to the top plate 308 at a first location 432. In some embodiments, the support apparatus 408 is coupled to the top plate 308 at a second location 434. In some embodiments, the top plate 308 includes fastener openings 438 at the first location 432 and the second location 434 so that the support apparatus 408 may be coupled to the top plate 308 at various positions as desired.

In some embodiments, the one or more slit valves 115 are coupled to the link chamber body 310 via fasteners 440, or pins, extending through the fastener openings 332. In some embodiments, the one or more slit valves 115 includes fastener recesses 470 corresponding with locations of the one or more recesses 330. In some embodiments, the link chamber 104 includes recess covers 416 configured to cover the one or more recesses 330 and any exposed fasteners or pins. The one or more slit valves 115 may also rest in the lower recesses 354 to further secure the one or more slit valves 115. Each of the one or more slit valves 115 may include an actuator 422 configured to move a slit valve door 454 to selectively open or close a slit opening 456 for passing a substrate therethrough. In some embodiments, any unused facets of the plurality of facets 114 may be covered with a cover plate 410.

Figure 5:
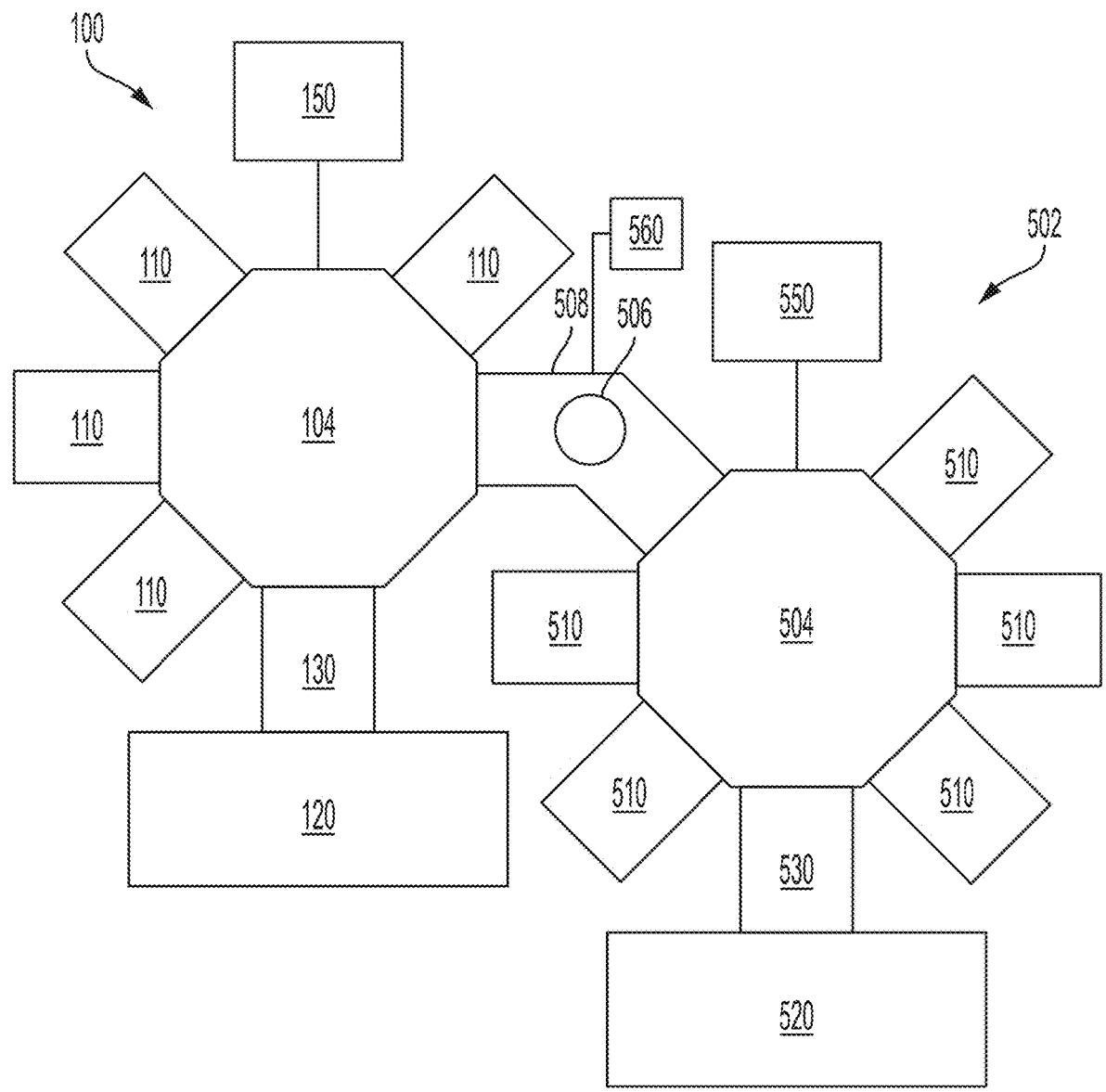
FIG. 5 depicts a schematic top view of multiple connected multi-chamber processing tools having link chambers in accordance with at least some embodiments of the present disclosure.

FIG. 5 depicts a schematic top view of multiple connected multi-chamber processing tools having link chambers in accordance with at least some embodiments of the present disclosure. In some embodiments, the multi-chamber processing tool 100 is coupled to a second multi-chamber processing tool 502 having a second link chamber 504 to facilitate more complex processing. In some embodiments, the second link chamber 504 is similar to or the same as the link chamber 104 discussed above. A plurality of second process chambers 510 may be coupled to the second link chamber 504. In some embodiments, a second FI 520 is coupled to the second link chamber 504 via one or more second load lock chambers 530. A second controller 550 may be coupled to the second link chamber 504 and configured to operatively control the second multi-chamber processing tool 502. In some embodiments, the second controller 550 may be configured to be in communication with the controller 150 of the multi-chamber processing tool 100. In some embodiments, the controller 150 is configured to operatively control the multi-chamber processing tool 100 and the second multi-chamber processing tool 502.

In some embodiments, the multi-chamber processing tool 100 is coupled to a second multi-chamber processing tool 502 via a transfer via 508 coupled to one of the chamber openings of the plurality of chamber openings 304 and a corresponding chamber opening of the second link chamber 504. In some embodiments, more than two link chambers may be similarly coupled together to expand processing capabilities. In some embodiments, the transfer via 508 includes a substrate alignment device 506 that is positioned at one or more of the staging positions. The substrate alignment device 506 is configured to orient a feature on the one or more substrates 112 (i.e., wafer notch) in a correct orientation for processing in the process chambers of the multi-chamber processing tool 100 and the second multi-chamber processing tool 502. In some embodiments, the transfer via 508 may be angled to advantageously reduce floor space when multiple processing tools are coupled. In some embodiments, the transfer via 508 is coupled to a vacuum pump 560 to pump down the transfer via 508.

Figure 6:
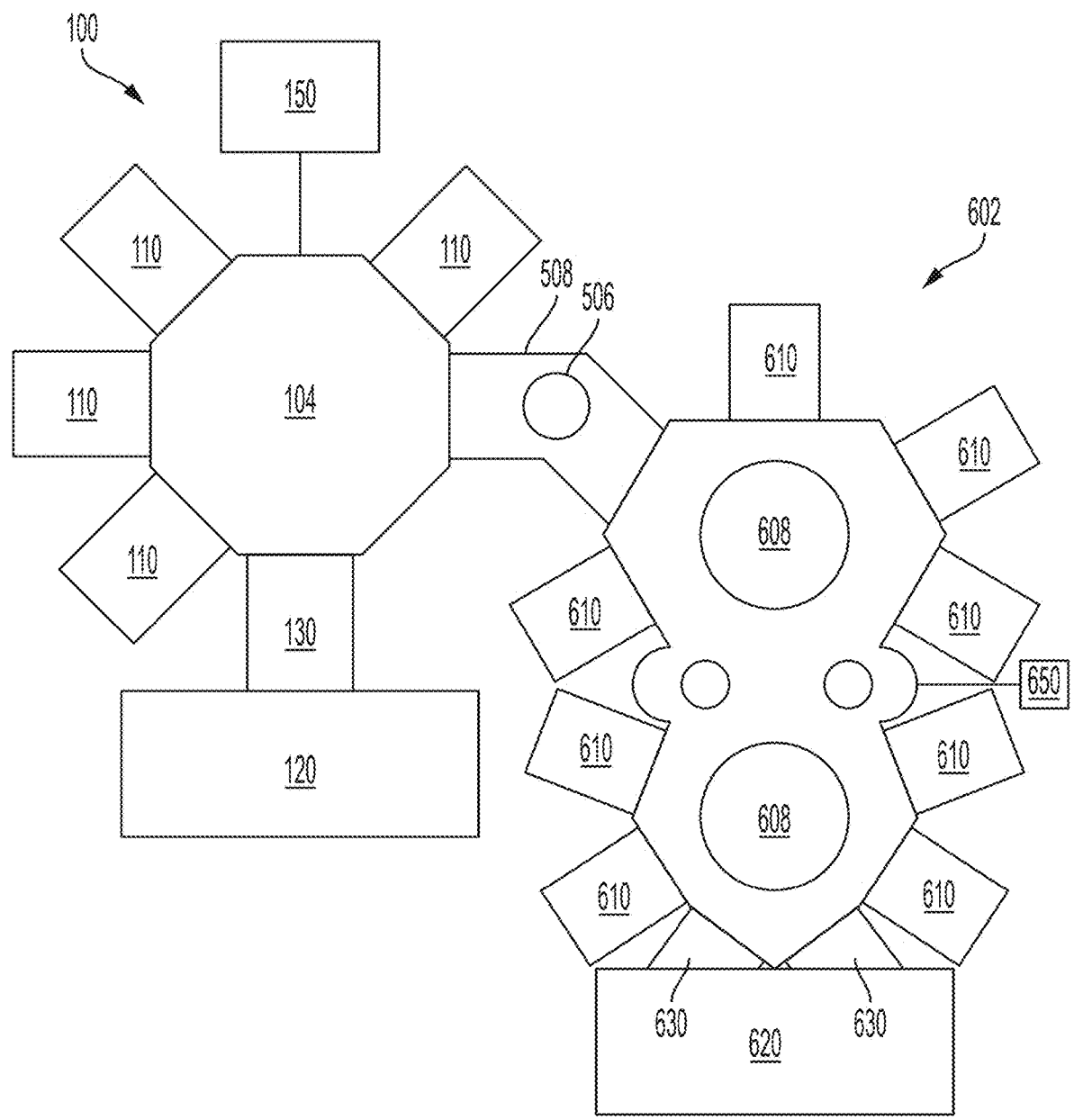
FIG. 6 depicts a schematic top view of a multi-chamber processing tool coupled to a second processing tool in accordance with at least some embodiments of the present disclosure.

FIG. 6 depicts a schematic top view of a multi-chamber processing tool coupled 100 to a second processing tool 602 in accordance with at least some embodiments of the present disclosure. In some embodiments, the link chamber 104 of the multi-chamber processing tool 100 may be coupled to the second processing tool 602 via the transfer via 508. In some embodiments, the second processing tool 602 may include the Endura 2 mainframe or an Endura 3 mainframe available from Applied Materials, Inc. of Santa Clara, California. In some embodiments, the second processing tool 602 may comprise any suitable mainframe having a plurality of process chambers. The second processing tool 602 may generally include a FI 620 coupled to one or more transfer chambers 608 via one or more load lock chambers 630. A plurality of process chambers 610 are coupled to the one or more transfer chambers 608. Substrates may be transferred between the FI 620, the transfer chambers 608, and the plurality of process chambers 610 via transfer robots (not shown) disposed in one or more of the FI 620 and the one or more transfer chambers 608. The one or more substrates 112 may be transferred from the multi-chamber processing tool 100 to the second processing tool 602 via the transfer via 508 for enhanced processing while advantageously minimizing floorspace. The second processing tool 602 may include a second controller 650 configured to operatively control the second processing tool 602 and be in communication with the controller 150 of the multi-chamber processing tool 100. In some embodiments, the controller 150 is configured to operatively control the multi-chamber processing tool 100 and the second processing tool 602.

While the foregoing is directed to embodiments of the present disclosure, other and further embodiments of the disclosure may be devised without departing from the basic scope thereof.

The invention claimed is:

1. A link chamber for use in a multi-chamber processing tool, comprising:
    a link chamber body having a plurality of facets extending between a bottom plate and a top plate, wherein at least seven of the plurality of facets have a chamber opening to form a plurality of chamber openings, wherein the plurality of chamber openings are sized to pass a substrate therethrough, and wherein each of the plurality of chamber openings is configured to be coupled to a slit valve, a load lock chamber, a cover plate, a process chamber, or a second link chamber body, wherein the top plate of the link chamber body includes one or more recesses proximate each of the plurality of chamber openings, wherein each of the one or more recesses includes fastener openings extending from a sidewall of the one or more recesses to a radially outer sidewall of the link chamber body.

2. The link chamber of claim 1, further comprising one or more slit valves coupled to the link chamber and configured to selectively seal one or more of the plurality of facets.

3. The link chamber of claim 1, further comprising a transfer robot disposed in an interior volume of the link chamber body and coupled to the bottom plate.

4. The link chamber of claim 1, further comprising one or more pump ports disposed through the bottom plate.

5. The link chamber of claim 4, further comprising a pump coupled to the one or more pump ports.

6. The link chamber of claim 1, wherein the bottom plate of the link chamber body includes a plurality of actuator openings proximate corresponding ones of the plurality of chamber openings and configured for passing an actuator of a slit valve therethrough.

7. The link chamber of claim 1, wherein the one or more recesses comprise two recesses.

8. The link chamber of claim 1, wherein the top plate includes a lid opening, and further comprising a lid removably coupled to the top plate to close the lid opening, wherein the lid is pivotably coupled to the top plate.

9. A multi-chamber processing tool, comprising:
a factory interface (FI) having one or more loadports configured to receive a substrate;
the link chamber of claim 1 coupled to the FI;
a plurality of process chambers coupled to the link chamber via respective ones of the plurality of chamber openings;
one or more load lock chambers coupled to the link chamber via respective one or more of the plurality of chamber openings; and
a link robot disposed in the link chamber and configured to facilitate transferring the substrate from the FI to the plurality of process chambers via the one or more load lock chambers.

10. The multi-chamber processing tool of claim 9, wherein the plurality of process chambers include four deposition chambers and two cleaning chambers.

11. The multi-chamber processing tool of claim 9, further comprising a transfer via coupled to one of the plurality of chamber openings, wherein the transfer via is connectable to a transfer chamber of a second processing tool.

12. The multi-chamber processing tool of claim 9, wherein the plurality of process chambers include four process chambers, and the one or more load lock chambers include two load lock chambers.

13. The multi-chamber processing tool of claim 9, wherein the one or more load lock chambers include one load lock chamber, and wherein the one load lock chamber includes a substrate transfer mechanism configured to move the substrate from a location proximate the FI to a location proximate the link chamber.

14. The multi-chamber processing tool of claim 13, wherein the substrate transfer mechanism is a substrate carousel, a load lock transfer robot, or a servo-controlled shutter.

15. A multi-chamber processing tool, comprising:
a factory interface (FI) having one or more loadports configured to receive a substrate;
the link chamber of claim 1 coupled to the FI, wherein the bottom plate of the link chamber includes one or more pump ports, and wherein the bottom plate includes a plurality of valve openings proximate corresponding ones of the plurality of chamber openings;
a plurality of process chambers coupled to the link chamber via respective ones of the plurality of chamber openings;
one or more load lock chambers coupled to the link chamber via respective one or more of the plurality of chamber openings; and
a link robot disposed in the link chamber and configured to facilitate transferring the substrate from the FI to the plurality of process chambers via the one or more load lock chambers.

16. The link chamber of claim 6, wherein the plurality of actuator openings are at least partially disposed radially inward of sidewalls defined by the plurality of chamber openings.

17. The link chamber of claim 6, wherein at least one of the plurality of actuator openings extends at an angle that is not ninety degrees with respect to a vertical axis of the link chamber body.

18. The link chamber of claim 1, wherein each of the plurality of facets includes a seal groove disposed about the plurality of chamber openings.

19. The link chamber of claim 1, wherein the link chamber body has an octagonal shape.

20. The link chamber of claim 19, wherein the link chamber body includes seven facets and an eighth side that does not include a chamber opening of the plurality of chamber openings.

* * * * *